United States Patent [19]
Reid, deceased et al.

[11] Patent Number: 5,159,700
[45] Date of Patent: Oct. 27, 1992

[54] SUBSTRATE WITH OPTICAL COMMUNICATION SYSTEMS BETWEEN CHIPS MOUNTED THEREON AND MONOLITHIC INTEGRATION OF OPTICAL I/O ON SILICON SUBSTRATES

[75] Inventors: Lee R. Reid, deceased, Plano, Tex., Theresa G. Reid, administratrix; Han-Tzong Yuan, Dallas, Tex.

[73] Assignee: Texas Instruments Incorporated, Dallas, Tex.

[21] Appl. No.: 668,666

[22] Filed: Mar. 13, 1991

Related U.S. Application Data

[63] Continuation-in-part of Ser. No. 571,044, Jan. 16, 1984, Pat. No. 5,009,476.

[51] Int. Cl.$^5$ .............................. G02B 6/10; G02B 5/14
[52] U.S. Cl. ....................................................... 385/14
[58] Field of Search ........................... 350/96.10–96.14

[56] References Cited

U.S. PATENT DOCUMENTS

| | | | |
|---|---|---|---|
| 3,879,606 | 4/1975 | Bean | 350/96.12 X |
| 3,948,583 | 4/1976 | Tien | 350/96.11 X |
| 4,585,299 | 4/1986 | Strain | 350/96.12 |
| 4,652,077 | 3/1987 | Erman et al. | 350/96.11 X |
| 4,652,290 | 3/1987 | Cho et al. | 350/96.12 |
| 4,693,543 | 9/1987 | Matsumura et al. | 350/96.12 X |
| 4,762,382 | 8/1988 | Husain et al. | 350/96.12 |
| 5,009,476 | 4/1991 | Ried et al. | 350/96.11 |

Primary Examiner—Akm E. Ullah
Attorney, Agent, or Firm—Richard A. Stoltz; Richard L. Donaldson; Jay Cantor

[57] ABSTRACT

A circuit composed of a circuit board of crystalline elemental silicon slice and circuit components in the form of semiconductor integrated circuits therein which are preferably formed of a Group III-V compound. Signals from each of the integrated circuits are transmitted to other integrated circuits on the board or externally of the board either by conventional printed conductors on the board or by a laser formed in each integrated circuit at each output terminal thereon which transmits light signals along light transmitting members in the silicon board to detectors at the input locations on other ones of the integrated circuits on the board for external to the board. The light signal is transferred from an integrated circuit output to an integrated circuit input or to a device external to the board by means of light transmitting members. These light transmitting members may be light conducting waveguides positioned either on the surface of the board or in grooves formed therein. Alternatively, the light transmitting members can be silicon dioxide paths formed in the silicon circuit board by selective oxidation of the silicon board to form silicon dioxide light transmitting paths therein. Each light transmitting path is coupled between a light emitting output from an integrated circuit and a light receiving input of another integrated circuit on the same or a different semiconductor chip or travels to the edge of the circuit board for transmission external of the board.

14 Claims, 4 Drawing Sheets

SUBSTRATE WITH OPTICAL COMMUNICATION SYSTEMS BETWEEN CHIPS MOUNTED THEREON AND MONOLITHIC INTEGRATION OF OPTICAL I/O ON SILICON SUBSTRATES

CROSS REFERENCE TO PRIOR APPLICATIONS

This application is a continuation in part of prior application Ser. No. 571,044, filed Jan. 16, 1984 now U.S. Pat. No. 5,009,476, the contents of which are incorporated herein by reference.

BACKGROUND OF THE INVENTION

1. Field of the Invention

This invention relates to a system for communication between semiconductor chips on a semiconductor substrate.

2. Brief Description of the Prior Art

Optical I/O or optical interconnects are a powerful method to solve the I/O bottlenecks of high speed computing and signal processing (P. R. Haugen et al. "Optical Interconnects For High Speed Computing", Optical Engineering Vol. 25., pp. 1076, Oct. 1986). The technology required to implement optical I/O, however is not yet in place. First, most optical fiber technology is based upon 1.3 to 1.5 micrometer wavelength which was developed to handle one-on-one long distance communication. It is extremely difficult to adapt optical fiber technology for wafer level multiple access I/O systems The effort to develop dedicated optical I/O chip through opto electronic inteqrated circuit (OEIC) technology (T. Iwama et al. "4×4 OEIC Switch Modules Using GaAs Substrate", IEEE Journal of Lightwave Technology, Vol 6, pp. 772, Jun. 1988) also found limited success because of the difficulty to integrate GaAs based OEIC chips with silicon VLSI chips in a hybrid manner.

Prior art complex semiconductor circuits have often been constructed by use of plastic or ceramic circuit boards having semiconductor packages mounted thereon with interconnection or communication between semiconductor packages taking place via conductors formed on the circuit board. Problems of heat dissipation and cross talk are minimized in such circuits by spreading out the components sufficiently on the circuit board surface. It is also known in the prior art that, as the signal being communicated increases to a clock rate of over about 50 megahertz, the conductors on the printed circuit board begin to act as transmission lines and display capacitive and inductive properties. It is therefore necessary that appropriate measures be taken as in the case of transmission lines to obtain proper impedance matching to avoid reflections and the like. This problem is relatively minor and, in general, no particular attention was needed in the past if the check rate was below about 10 megahertz. However, with the continued emphasis in high speed operation of the components and with the increased miniaturization of the integrated circuit chips themselves and the desire for higher packing density on the printed circuit boards, the above noted problems become more and more of a bottleneck. For example, the number of pins entering and exiting integrated circuit packages has remained relatively constant since the package size and chip size have remained relatively constant. However, the number of components contained on the chip has continually increased. According to Ruth's law, the number of pins out of the chip is proportional to $K^{\frac{2}{3}}$, where K is the number of gates on the chip. It follows that the number of pins on the package cannot increase whereas the necessity to do so exists. The problem of insufficient pins has been remedied in the prior art by multiplexing. However, multiplexing defeats the desire for high speed operation. Also, there is an increase in the problem of matching each pin and the path thereto or therefrom from reflections and other transmission line type problems. Furthermore, substantial heat will be generated in the input and output drivers, both from the increase in component packing density per chip as well as the increase in packing density of the chips on the printed circuit board.

SUMMARY OF THE INVENTION

In accordance with the present invention, the above noted problems of the prior art are substantially minimized and there is provided a complex circuit composed of a circuit board which is formed of elemental silicon in the form of a slice and circuit components in the form of semiconductor integrated circuits thereon which are preferably formed of a Group III-V compound. Signals from each of the integrated circuits are transmitted to other integrated circuits on the board or externally of the board either by conventional printed conductors on the board or, preferably, by means of a laser or LED formed in each integrated circuit at each output terminal thereon which transmits light signals along light transmitting members in the silicon board to photodetectors at the input locations on other ones of the integrated circuits on the board for external to the board. It is therefore readily seen that each light emitting output will be composed preferably of a laser diode or the like and each input member will be composed preferably of a photodetector or the like.

The light signal is transferred from an inteqrated circuit output to an integrated circuit input or to a device external to the board by means of light transmitting members. These light transmitting members may be light conducting waveguides positioned either on the surface of the board or in grooves formed therein. Alternatively, the light transmitting members can be dielectric, such as silicon dioxide paths formed in the silicon circuit board by selective oxidation of the silicon board to form silicon dioxide light transmitting paths therein. Each light transmitting path will be coupled between a light emitting output from an integrated circuit and a light receiving input of another integrated circuit or travel to the edge of the circuit board for transmission external of the board. The transmission of light frequencies between circuit boards or the like permits replacement of a single light channel for what would be required of a many pinned device and connector and eliminates the crosstalk problems caused thereby as noted hereinabove as well as eliminating the impedance match required to provide sufficient noise margins between circuit boards in prior art standard non-light frequency applications.

The light transmitting member will be coupled to the light emitting member and the light receiving member of the integrated circuits by standard coupling means such as a light transmitting epoxy or the like as are well known in the art. Such coupling techniques are shown in "photo-Coupled Logic—A Hopeful Prospect", by D. A. Fraser, pages 31 to 34; "Coupling Light Sources to Fibers" by Mark L. Dakss, Laser Focus, December, 1975, pages 31 to 34; "Optical Waveguides Fabricated by Preferential Etching" by Won-Tien Tsang, Cheng-Chung Tseng and Shyh Wang, Applied Optics, Vol. 14, No. 5, May, 1975, pages 1200 to 1206; "Optical Coupling From Fibers to Channel Waveguides Formed on Silicon" by J. T. Boyd and S. Stiram, Applied Optics, Vol. 17, No. 6, 15 Mar. 1978, pages 895 to 898; "A Low-Scattering Graded-Index $SiO_2$ Planar Optical Waveguide Thermally Grown on Silicon", by David E. Zeimon et al., Applied Physics Letters, Vol. 42, No. 7, 1 Apr. 1983, pages 665 and 666; and "GaAs Optical Electronic Devices for Signal Processing Application", by L. R. Tomesetta, SPIE Vol. 176, Guided Wave Optical Systems and Devices II (1979), pages 111 to 114, all of which are incorporated herein by reference.

In accordance with a further embodiment of the present invention, the GaAs optical components are monolithically integrated on a silicon CMOS chip, thus solving the above described problem. This embodiment is based upon the ability to qrow single crystal GaAs on a silicon substrate. Although GaAs was successfully grown on silicon substrates to fabricate LEDs and laser diodes (D. W. Nam et al., "Stable Continuous Room-Temperature Laser Operation of AlGaAs-GaAs Quantum Well Heterostructure Grown on Si", Applied Physics Letters 51 (1), page 39, 1987 and D. G. Deppe et al. "Effects of Microcraking on AlGaAs/GaAs Quantum Well Lasers Grown on Si", Applied Physics Letters. Vol. 53, pp 874, Sep. 1988), the utility for optical interconnection was never demonstrated. On the other hand, a scheme to fabricate optical channels in silicon and subsequently mount GaAs optical devices on the silicon wafer to furnish a wafer level optical interconnect is described herein. In accordance with this further embodiment, the GaAs optical devices are monolithically integrated on the silicon wafer. Such integration allows VLSI circuits and optical channels to be fabricated whereby optical channels are etched out of silicon and are filled with dielectric materials, such as $SiO_2$ doped with Ge to guide the optical signals. Optical devices, such as GaAs LEDs, lasers and photodetectors are built into GaAs inserts which are located at the edge of the VLSI circuits. The optical devices are connected to the VLSI through metal interconnects on one side and coupled to optical channels on the other side. Since everything is fabricated monolithically through lithographic techniques, not only is the components alignment not a problem, but also the optical coupling will have minimum loss.

DESCRIPTION OF THE PREFERRED EMBODIMENTS

Figure 1:
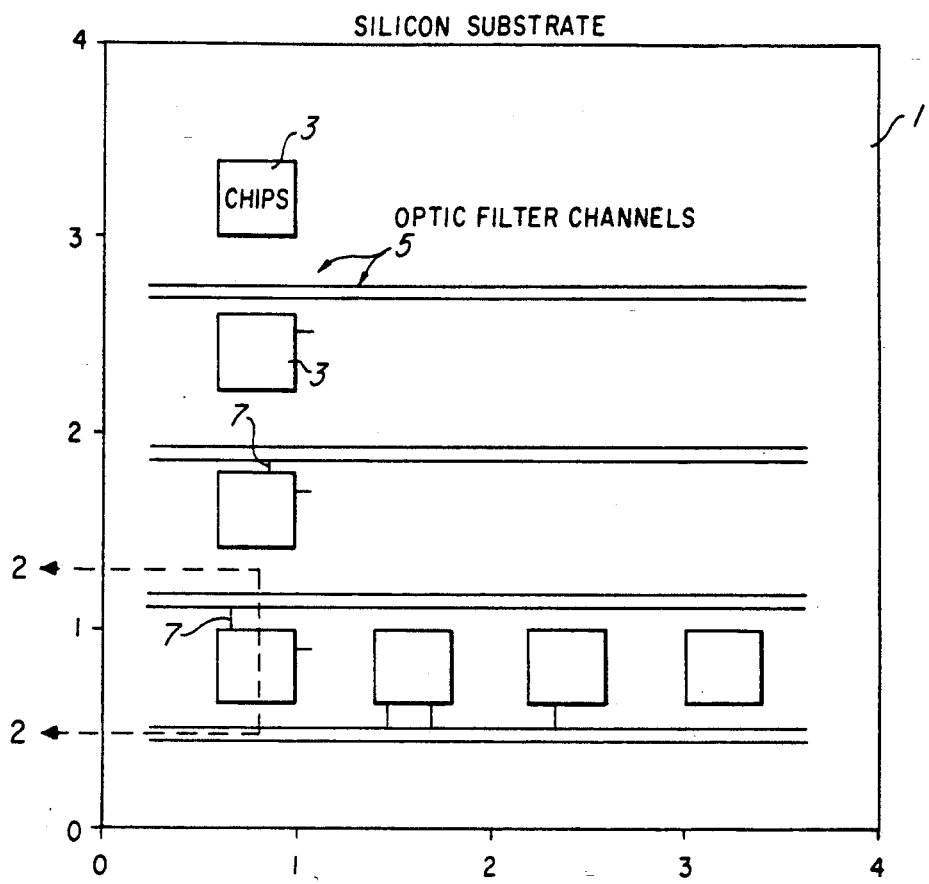
FIG. 1 is a top view of a complex electronic circuit in accordance with the present invention.
Figure 2:
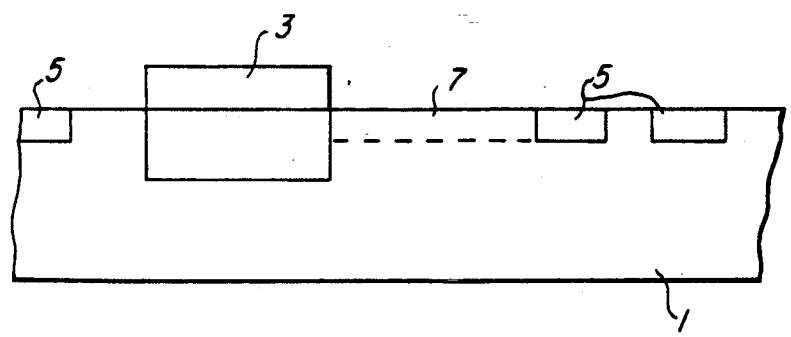
FIG. 2 is a view taken along the line 2—2 of FIG. 1.
Figure 3:
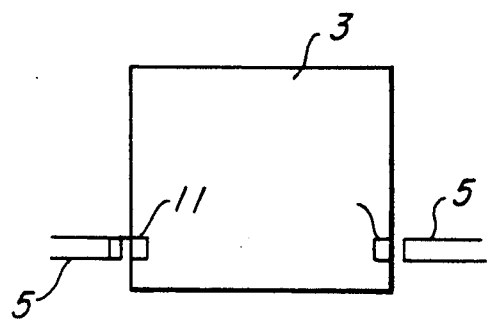
FIG. 3 is a schematic diaqram of a chip optically coupled to a pair of optical channels via a laser and a phototransistor.

Referring now to FIGS. 1 and 2, there is shown a circuit board 1 formed of a silicon slice and having positioned thereon a plurality of semiconductor chips 3 preferably formed from a Group III–V material, which are secured to the top surface of the board 1 by appropriate bonding techniques. A plurality of guided optic channels 5 are formed in or on the board in manner to be described in more detail hereinbelow. Coupling elements 7 couple outputs 9 (FIG. 3) from the chip 3 to guided optic channels 5 and also couple the guided optic channels 5 to inputs 11 (FIG. 3) to the chips 3. Each of the chips 3 has either or both of a light emitting output element 9 which can be in the form of a laser diode which is coupled to one of the quided optic channels 5 as shown in FIG. 3 and an input element 11, preferably in the form of a photo responsive diode which is also coupled to a guided optic channel 5. The guided optic channels 5 as shown in FIG. 3 also provide communication between plural circuit boards or a circuit board and an external optical transmitter and/or receiver.

The guided optic channel 5 can be formed in several ways. In accordance with the first embodiment, grooves are formed in the upper surface of the circuit board I and standard guided optic elements 5 are deposited and secured therein. When such standard guided optic elements are utilized, the material from which the circuit board is formed need not be silicon but can be any standard board material. As a second alternative, the circuit board 1 will be of crystalline silicon and the quided optic channels 5 are formed therein by standard semiconductor oxidation techniques wherein, for example, a silicon nitride pattern will be formed on the surface of the board 1 and the board will then either be etched in the regions where the guided optic channels are to be formed with subsequent oxidation of the exposed silicon to fill the channel with silicon dioxide or, alternatively, after pattern formation with silicon nitride, the exposed silicon will be oxidized with subsequent optional etching back of the silicon oxide formed to an appropriate level if desired or required. The silicon dioxide formed by oxidation of the silicon board will act as a guided optic channel and will have light conducting properties as is shown in the above mentioned publications.

The semiconductor chips 3 will preferably be formed from a Group III–V compound, preferably gallium arsenide, so that, in addition to circuit components, either one or more laser diodes 9 or light responsive devices 11 or both can be formed in each of the chips to permit communication both into and out of each chip to provide the I/O terminals therefor. It should be understood that each chip can have a plurality of optical output devices 9 and/or a plurality of optical input devices 11.

It is readily apparent that, since each of the guided optic channels 5 is a transmitter of light, and since light signals can go up to about 2 GHz bandwidth, it is possible to replace, for example, 10 electrical signal paths by one light conductor 5, each with a 200 MHz signal bandwidth. It is therefore apparent that, since plural different signals can be placed on the same line, an equivalent number of input and/or output terminals can be eliminated physically from the chip itself, thereby materially decreasing the space requirement. In addition, since optical signals are being utilized, there is no problem of impedance matching or other problems resulting from the use of high frequencies. Furthermore, since the light is confined to the optic guide, there will be no cross talk across channels Also, the problem of heat generation is substantially minimized by the use of optical transmissions.

Figure 4:
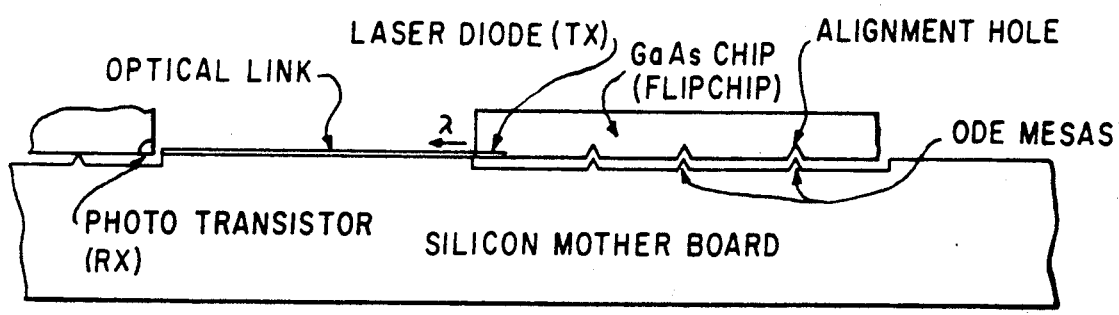
FIG. 4 is a schematic diagram of a circuit in accordance with a second embodiment of the invention.

Referring now to FIG. 4, there is shown a further embodiment of the invention. If FIG. 4, there is shown a silicon circuit board 21 having mesas 23 formed in selected regions of the surface thereof which line up with alignment holes 25 formed on the surface of a gallium arsenide chip 27 of the type known in the art as a "flipchip". The mesas 23 are formed by standard well known orientation dependent etchants (ODE) to provide the desired mesa shape. The chip 27 includes a laser diode 29 which is lined up with an optical link 31 on the surface of the board 21 due to the selective formation of the mesas 23 to provide the alinement. The optical link 31 can be an optical waveguide placed in a groove formed in the board 21 or on the surface of the board 21 or can be an SiO2 path formed in the board in the manner described hereinabove and in the above noted publications. Also shown is a further chip 33 positioned over mesas 35 which are the same as mesas 23 having a phototransistor 37 lined up with the optical link 31. Information at optical frequencies is transmitted from laser diode 29 to phototransistor 37 via optical line 31. In the above described embodiment, the ODE mesas 23 are coupled to pads on the chips 27 and 33 to provide a voltage source, ground connection and as a signal input and output as well as for alignment as noted above.

Figure 5:
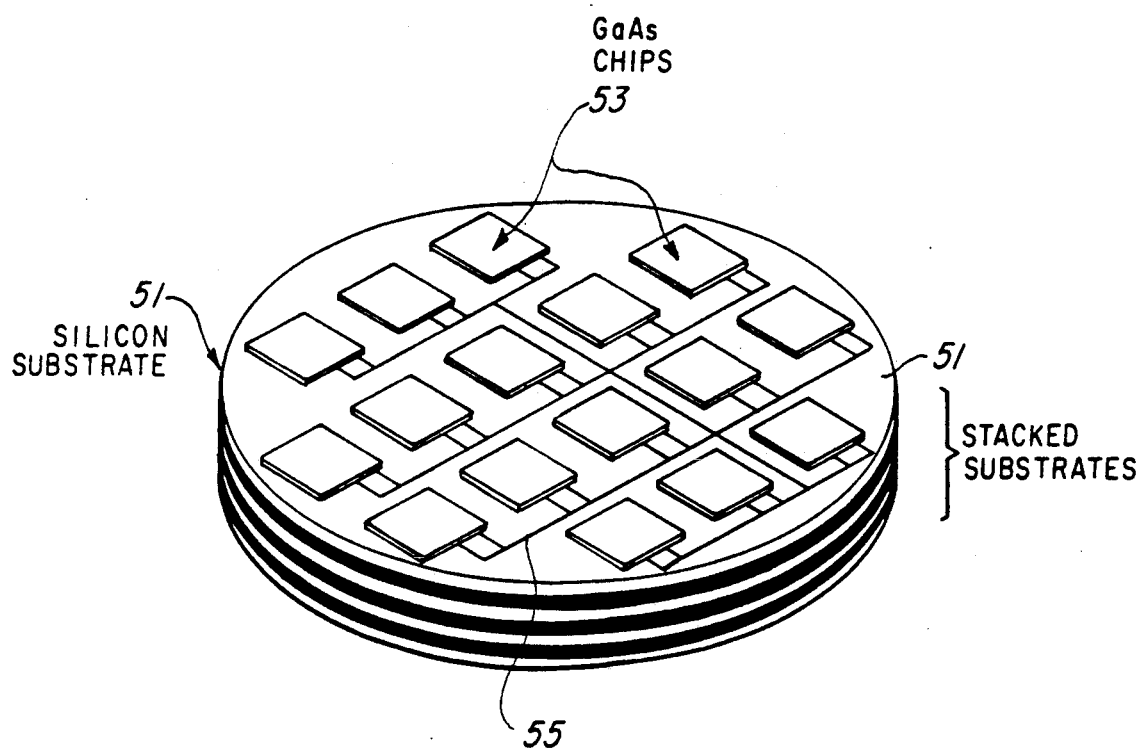
FIG. 5 is a schematic diagram of a plurality of stacked circuits in accordance with the present invention.

Boards or substrates of the type shown in FIGS. 1 to 4 can be stacked as shown in FIG. 5. Communication among the stacked boards can be by electrical connection in standard manner and/or by running optical links from board to board. As shown in FIG. 5, four boards 51 are stacked, one atop the other. Gallium arsenide chips 53 are positioned on the boards and interconnected on each board 51 by optical links 55. Optical fibers (not shown) travel between optical links 55 from any board 51 to an optical link on a further board 51 to provide optical communication between boards.

Figure 6A:
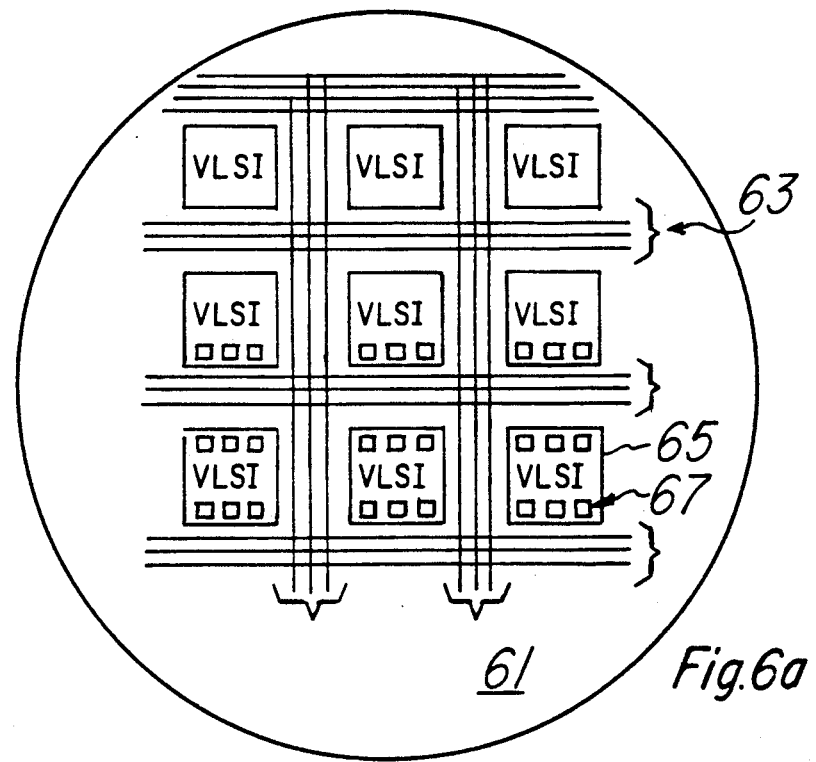
FIGS. 6a and 6b describe wafer level integration with optical I/O in accordance with a further embodiment of the invention.
Figure 6B:
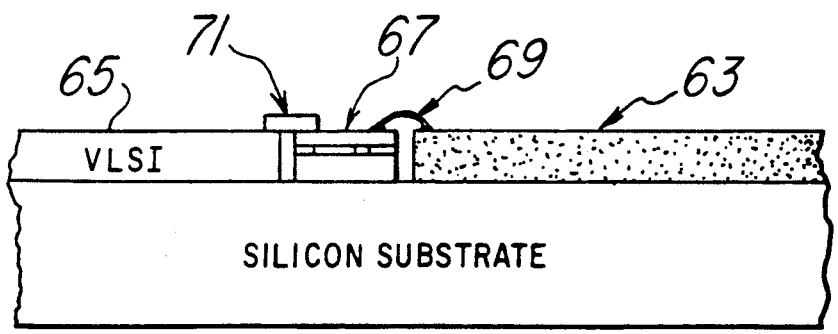

Referring now to FIGS. 6a and 6b, there is shown a further embodiment of the invention wherein the Group III-V optical devices are monolithically integrated onto a silicon substrate. There is shown a silicon wafer 61 having optical channels 63 disposed therein. The optical channels 63 are formed either by etching optical channels in the silicon wafer 61 and then filling the etched out channels with light conducting dielectric material, such as, for example, SiO2 doped with germanium in standard manner or by masking the wafer 61 to expose the optical channel regions and then oxidizing the exposed regions as discussed hereinabove to form silicon oxide channels in the wafer itself. Each of the VLSI regions 65 is a silicon region havinq active and passive devices fabricated therein in standard manner. In addition, GaAs or other Group III-V material 67 is grown on the silicon substrate and fabricated into an optical device, such as a phototransistor, laser diode or LED, in standard manner as described in the above referenced publications, which are incorporated herein by reference. Optical communication then takes place, as best shown in FIG. 6b via the optical coupling 69 between the optical device 67 and the channel 63 adjacent thereto. Some of the optical devices 67 are light transmitters and others are light receivers as in the above described embodiments to provide a complete communication link. The optical devices 67 are also coupled to conductive regions in the VLSI region 65 by electrical connections 71 as shown in FIG. 6b to provide electrical connection, as required. It should also be understood that optical channels 63 such as those described and shown which appear external to the VLSI regions 65 can also be provided within the VLSI regions themselves to optically couple optical devices 67 located on the same VLSI region. It should further be understood that inteqrated circuits can be fabricated in the VLSI regions themselves and be coupled to the optical devices 67. By providing the monolithic device described in connection with FIGS. 6a and 6b, it is possible to fabricate the entire monolithic circuit utilizing only standard processing steps as required for standard semiconductor processing.

Briefly, to recapitulate, it is possible in accordance with the present invention to provide chip to chip communication on a sinqle circuit board wherein the board itself is preferably, but not necessarily, a silicon substrate, wherein the optical channels are formed in the board itself by standard integrated circuit processing techniques and wherein Group III-V semiconductor devices are utilized for transmitting and receiving the optical signals transmitted via the circuit board itself The Group III-V devices can be monolithically integrated on the silicon wafer or substrate. Transmission along optical paths as opposed to electrical conductors permits much higher information transmission speed. In this way, a single optical channel can replace a plurality of conductors and/or pins, thereby minimizing the presently existing problem noted hereinabove Though the invention has been described with respect to a specific preferred embodiment thereof, many variations and modification will immediately become apparent to these skilled in the art. It is therefore the intention that the appended claims be interpreted as broadly as possible in view of the prior art to include all such variations and modifications.

It is claimed:

1. A method of forming an optical communication system which comprises the steps of:
    (a) providing a silicon substrate;
    (b) forming a channel in said silicon substrate capable of transmitting light frequency signals;
    (c) forming a group III-V semiconductor light transmitting device on said silicon substrate optically coupled to said channel; and
    (d) forming a group III-V semiconductor light receiving device on said silicon substrate optically coupled to said channel.

2. The method of claim 1 wherein said step of forming said channel comprises the steps of etching grooves in said silicon substrate and filling said etched grooves with silicon oxide.

3. The method of claim 2 wherein said silicon oxide is SiO2 doped with germanium.

4. The method of claim 1 wherein said step of forming said channel comprises the steps of masking said silicon substrate to expose predetermined regions of said silicon substrate and oxidizing the exposed predetermined regions of said silicon substrate to form silicon oxide in said exposed regions.

5. The method of claim 1 wherein said Group III-V composition is gallium arsenide.

6. The method of claim 2 wherein said Group III-V composition is gallium arsenide.

7. The method of claim 3 wherein said Group III-V composition is gallium arsenide.

8. The method of claim 4 wherein said Group III-V composition is gallium arsenide.

9. An optical communication system which comprises:
    (a) a silicon substrate;
    (b) a channel in said silicon substrate capable of transmitting light frequency signals;
    (c) a group III-V semiconductor light transmitting device on said substrate optically coupled to said channel; and
    (d) a group III-V semiconductor light receiving device on said silicon substrate optically coupled to said channel.

10. The system of claim 9 wherein said channel comprises grooves in said silicon substrate filled with silicon oxide.

11. The system of claim 10 wherein said silicon oxide is $SiO_2$ doped with germanium.

12. The system of claim 9 wherein said Group III-V composition is gallium arsenide.

13. The system of claim 10 wherein said Group III-V composition is gallium arsenide.

14. The system of claim 11 wherein said Group III-V composition is gallium arsenide.

* * * * *